United States Patent
Wei et al.

(10) Patent No.: US 10,602,632 B2
(45) Date of Patent: Mar. 24, 2020

(54) HOUSING, METHOD FOR MANUFACTURING THE SAME, AND ELECTRONIC DEVICE HAVING THE SAME

(71) Applicants: SHENZHEN FUTAIHONG PRECISION INDUSTRY CO., LTD., Shenzhen (CN); FIH (HONG KONG) LIMITED, Kowloon (HK)

(72) Inventors: Dian-Hong Wei, Shenzhen (CN); Yan-Min Wang, Shenzhen (CN); Guo-Liang Wan, Shenzhen (CN)

(73) Assignees: SHENZHEN FUTAIHONG PRECISION INDUSTRY CO., LTD., Shenzhen (CN); FIH (HONG KONG) LIMITED, Kowloon (HK)

( * ) Notice: Subject to any disclaimer, the term of this patent is extended or adjusted under 35 U.S.C. 154(b) by 0 days.

(21) Appl. No.: 16/234,893

(22) Filed: Dec. 28, 2018

(65) Prior Publication Data

US 2020/0060034 A1    Feb. 20, 2020

(30) Foreign Application Priority Data

Aug. 14, 2018 (CN) .......................... 2018 1 0922421

(51) Int. Cl.
| | |
|---|---|
| *H05K 5/04* | (2006.01) |
| *H05K 5/00* | (2006.01) |
| *H05K 5/02* | (2006.01) |
| *B29C 45/14* | (2006.01) |
| *B29L 31/34* | (2006.01) |
| *B29K 101/12* | (2006.01) |
| *B29K 705/00* | (2006.01) |

(52) U.S. Cl.
CPC .......... *H05K 5/04* (2013.01); *B29C 45/14311* (2013.01); *H05K 5/0017* (2013.01); *H05K 5/0247* (2013.01); *B29C 2045/14327* (2013.01); *B29K 2101/12* (2013.01); *B29K 2705/00* (2013.01); *B29L 2031/3481* (2013.01)

(58) Field of Classification Search
CPC ...... H05K 5/04; H05K 5/0247; H05K 5/0017; B29C 45/14311; B29C 2045/14327; B29L 2031/3481; B29K 2101/12; B29K 2705/00
See application file for complete search history.

(56) References Cited

U.S. PATENT DOCUMENTS

| | | | | |
|---|---|---|---|---|
| 9,728,839 | B2 * | 8/2017 | Gu | .......................... H01Q 1/243 |
| 2011/0223382 | A1 * | 9/2011 | Gu | .......................... B29C 70/78 |
| | | | | 428/136 |
| 2015/0021064 | A1 * | 1/2015 | Wang | .................... H05K 5/0243 |
| | | | | 174/50 |

(Continued)

FOREIGN PATENT DOCUMENTS

| | | |
|---|---|---|
| CN | 205736007 | 11/2016 |
| CN | 206118234 | 4/2017 |
| TW | 1565388 | 1/2017 |

*Primary Examiner* — Abhishek M Rathod
(74) *Attorney, Agent, or Firm* — ScienBiziP, P.C.

(57) ABSTRACT

A durable and compositely-integral housing of metal and plastic used for an electronic device includes a metal frame and a plurality of plastic filling members. The metal frame defines preset positions, and the preset positions have plastic-receiving notches. The plastic filling members are injection-molded into the notches for better adhesion and bond strength.

10 Claims, 8 Drawing Sheets

(56) References Cited

U.S. PATENT DOCUMENTS

| | | | |
|---|---|---|---|
| 2015/0188215 A1* | 7/2015 | Jarvis | H01Q 1/521 |
| | | | 343/702 |
| 2015/0189049 A1 | 7/2015 | Liu et al. | |
| 2016/0072932 A1* | 3/2016 | Hill | H04M 1/0249 |
| | | | 455/575.1 |
| 2016/0187925 A1* | 6/2016 | Yang | G06F 1/1626 |
| | | | 361/679.56 |
| 2016/0192517 A1* | 6/2016 | Tsao | H05K 13/00 |
| | | | 361/679.01 |
| 2017/0069956 A1* | 3/2017 | Hill | H01Q 1/243 |

\* cited by examiner

HOUSING, METHOD FOR MANUFACTURING THE SAME, AND ELECTRONIC DEVICE HAVING THE SAME

FIELD

The subject matter herein generally relates to housings and casings.

BACKGROUND

Metal housing used in electronic device has advantage in appearance, mechanical strength, and heat dissipation and more and more manufacturers design electronic devices with metal housing to meet the needs of consumers. Metal housing comprises metal frame. Some preset positions of the metal frame need to be assembled with plastic connecting members to form a metal housing to accommodate a display screen. However, metal and plastic materials have poor adhesion and can be easily separated and affect the quality of the housing.

Therefore, there is room for improvement within the art.

BRIEF DESCRIPTION OF THE DRAWINGS

Implementations of the present technology will now be described, by way of embodiments only, with reference to the attached figures.

DETAILED DESCRIPTION

Figure 1:
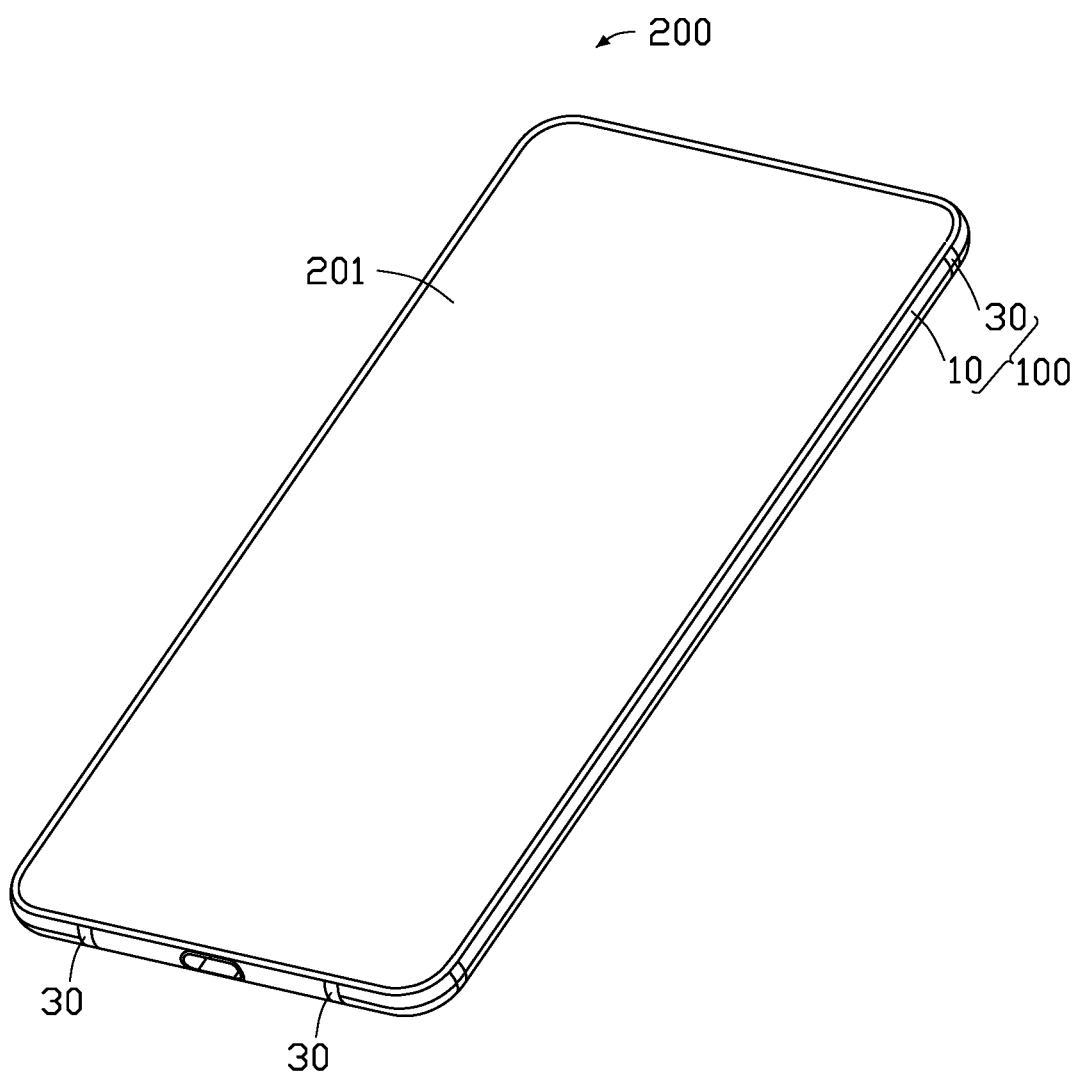
FIG. 1 is an isometric view of an electronic device in accordance with one embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

FIG. 1 illustrates a housing 100 adapted for an electronic device 200. The electronic device 200 may be, but is not limited to, devices such as mobile phones, PDA (Personal Digital Assistant), tablets, digital cameras, etc. The electronic device 200 includes, but is not limited to, a housing 100 and a display screen 201 detachably assembled in the housing 100. In the embodiment, the housing 100 is the external casing of the electronic device 200. The display screen 201 provides an interactive interface to interact with the electronic device 200. The electronic device 200 may further include, but is not limited to, other mechanical structures, electronic components, module, and software to perform its predefined functions.

In the embodiment, the housing 100 includes a metal frame 10, a plurality of plastic filling members 20, and some plastic connecting members 30.

The metal frame 10 is formed by casting, stamping, or computer numerical control (CNC) machine. A material of the metal frame 10 is selected from the group consisting of stainless steel, aluminum, magnesium, titanium, copper, and any combination thereof.

In the embodiment, the metal frame 10 is substantially a rectangular structure and includes a first metal portion 11, two second metal portions 12, two third metal portions 13, and a fourth metal portion 14. The first metal portion 11 is U-shaped. The second metal portion 12 is a cuboid. The third metal portion 13 is substantially L-shaped. The fourth metal portion 14 is a long strip structure. The first metal portion 11, one of the second metal portions 12, one of the third metal portions 13, the fourth metal portion 14, another one of the third metal portions 13, and another one of the second metal portions 12 are sequentially arranged to form the metal frame structure 10.

The metal frame 10 defines a preset position 15, the notches 16 are opened at the preset position 15.

Figure 2:
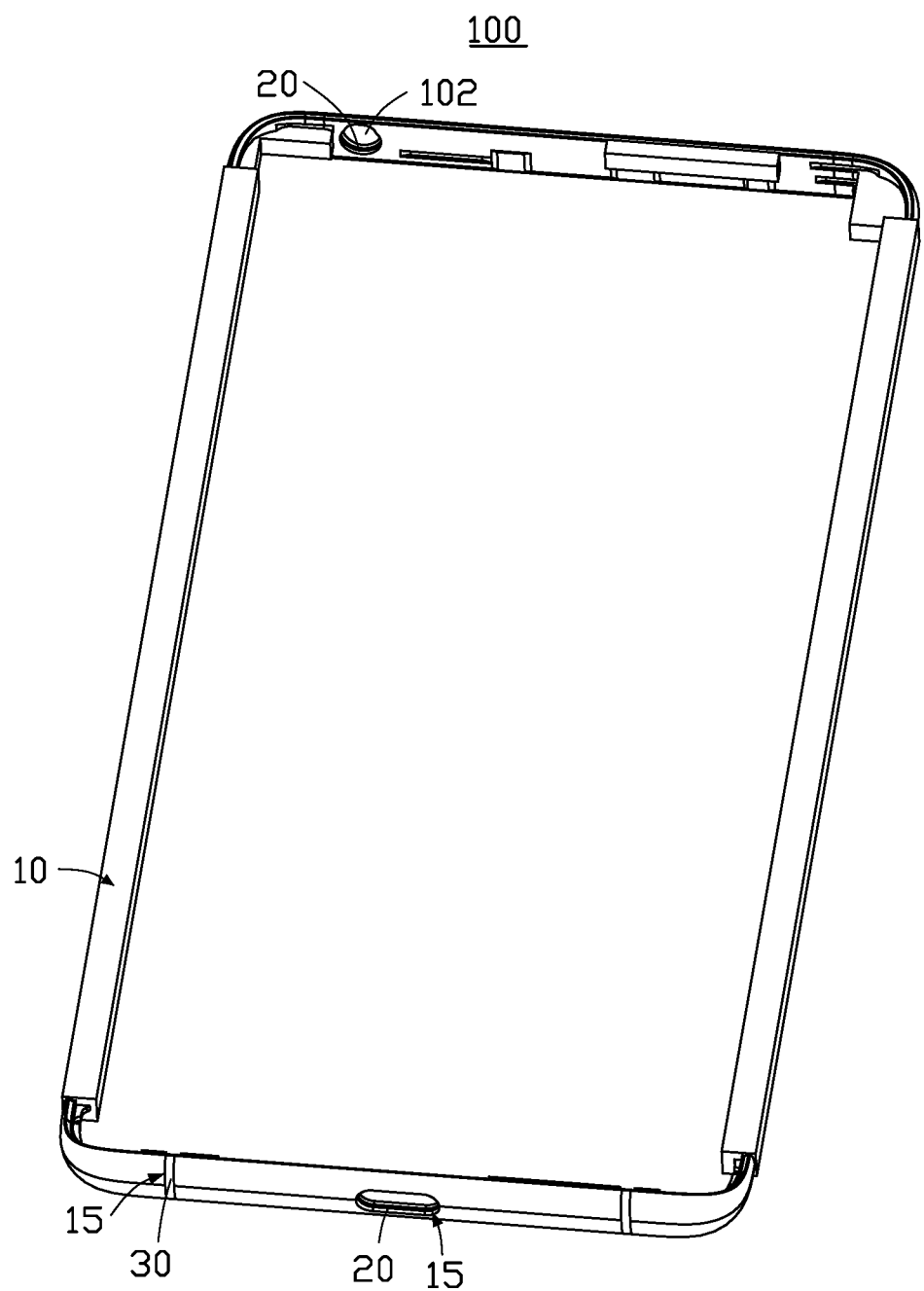
FIG. 2 is an isometric view of a housing in the electronic device in FIG. 1.
Figure 3:
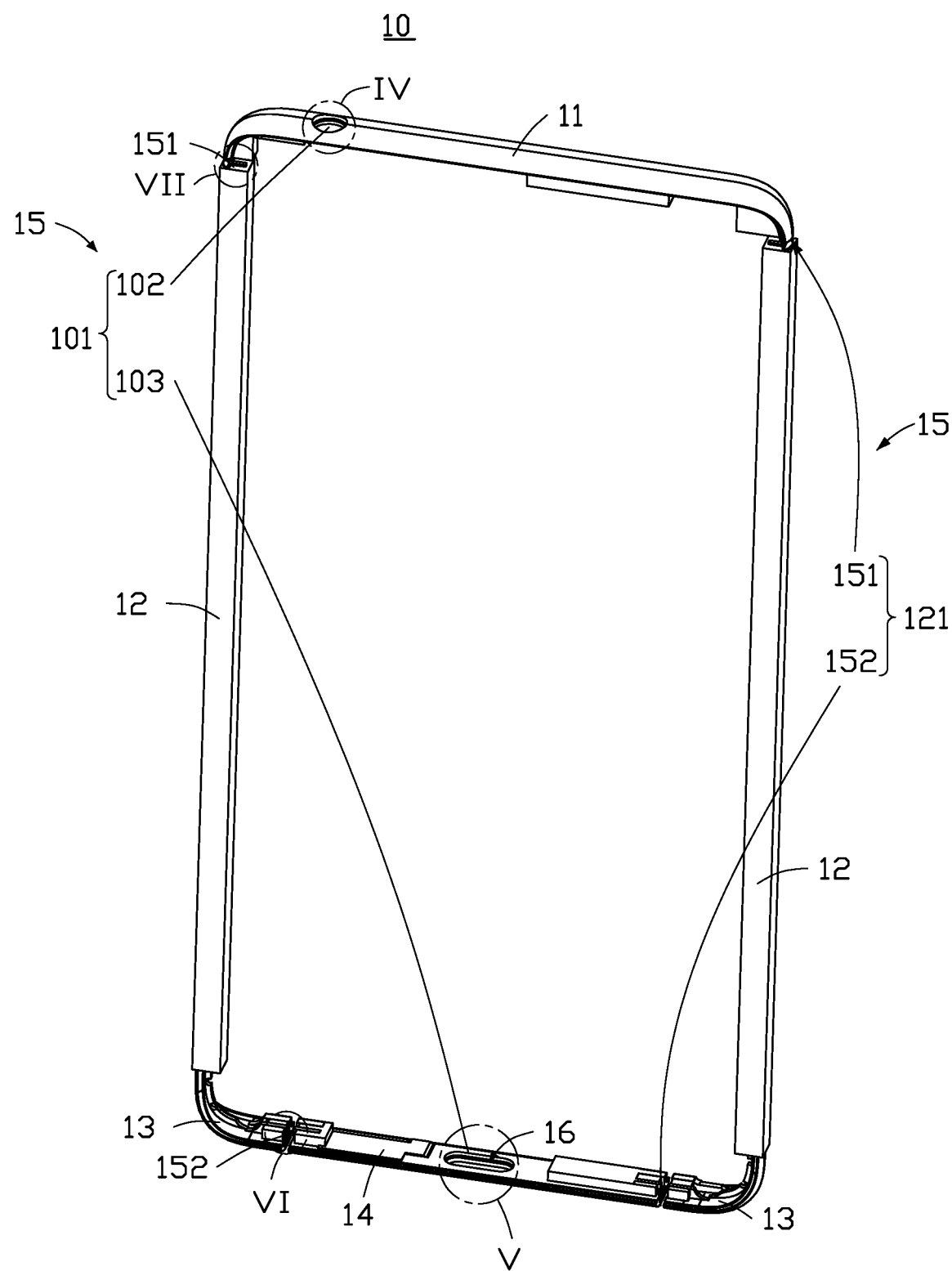
FIG. 3 is an isometric view of a metal frame in the housing in FIG. 2.

In the embodiment, the preset position 15 includes through holes 101 and partition regions 121, as shown in FIGS. 2-3. In the embodiment, the through holes 101 includes a headphone hole 102 arranged at the first metal portion 11 and a USB hole 103 arranged at the fourth metal portion 14. The partition regions 121 includes a first partition region 151 and a second partition region 152. The first metal portion 11 is spaced apart from the second metal portion 12 and forms the first partition region 151. The second metal portion 12 is connected with the third metal portion 13, the third metal portion 13 is spaced apart from the fourth metal portion 14 and forms the second partition region 152.

Each partition region 121 is a gap and includes two opposite surfaces, and the notch 16 of the partition region 121 is formed at one such surface.

The notches 16 are formed at the preset positions 15 by CNC cutters.

Each of the plurality of notches has a shape of circular, elliptical, square, rectangular, trapezoid, triangular, or T-shaped.

Figure 4:
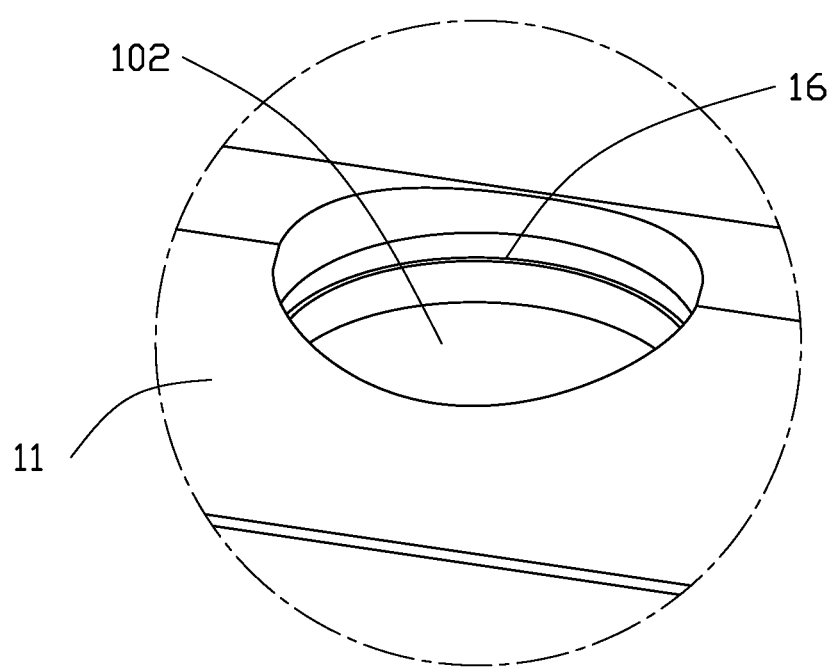
FIG. 4 is an enlarged view of circle IV-IV of FIG. 3.
Figure 5:
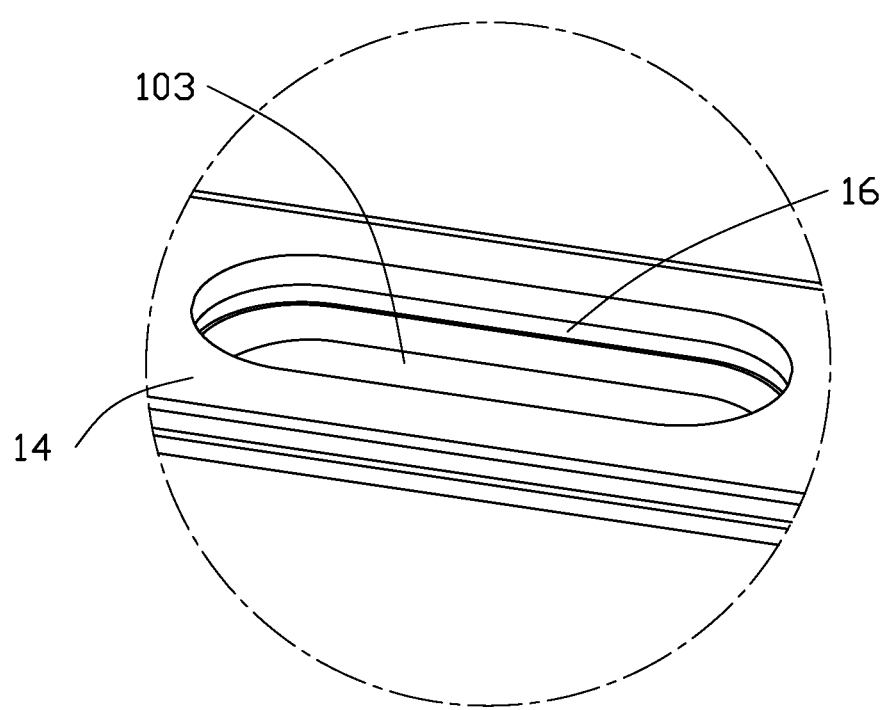
FIG. 5 is an enlarged view of circle V-V of FIG. 3.
Figure 6:
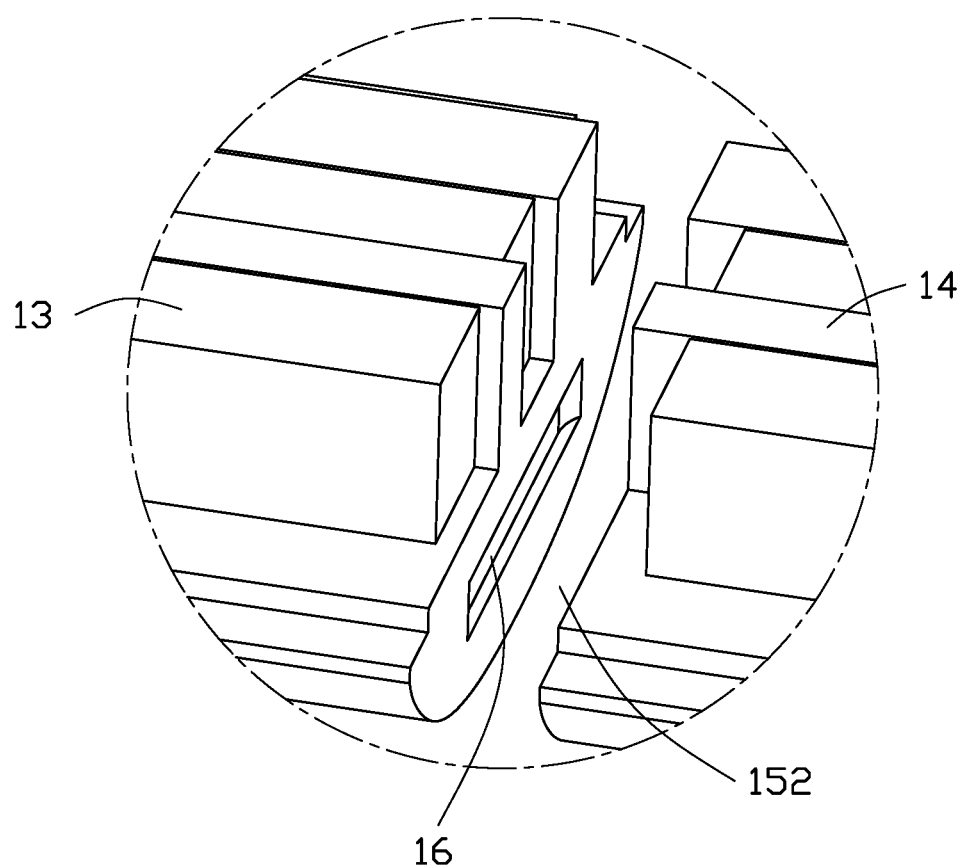
FIG. 6 is an enlarged view of circle VI-VI of FIG. 3.
Figure 7:
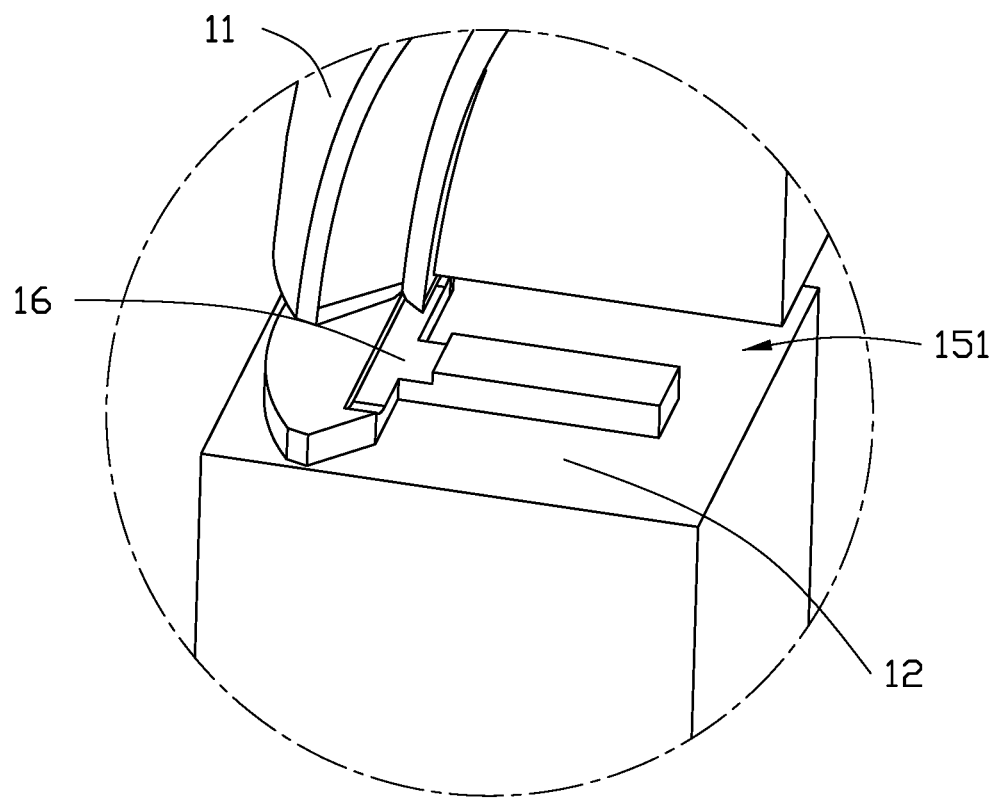
FIG. 7 is an enlarged view of circle VII-VII of FIG. 3.

In the embodiment, the notch 16 at the side wall of the headphone hole 102 is circular (as in FIG. 4), the notch 16 at the side wall of the USB hole 103 is elliptical (as in FIG. 5), the notch 16 at the surface of the second partition region 152 is rectangular (as in FIG. 6), and the notch 16 at the surface of the first partition region 151 is T-shaped (as in FIG. 7).

The plastic filling members 20 are placed in the notches 16 by injection molding. A structure of each of the plurality of plastic filling members 20 is matched with the shape of each of the plurality of notches 16, as shown in FIG. 2.

A material of the plastic filling member 20 is selected from thermoplastic or thermosetting plastics. Thermoplastic plastics is selected from the group consisting of polybutylene terephthalate (PBT), polyphenylene sulfide (PPS), poly (ethylene terephthalate) (PET), polyether ketone (PEEK), polycarbonate (PC), and polyvinyl chloride (PVC). Thermosetting plastics is selected from epoxy resin, polyurea resin, or UV adhesive. The UV adhesive is acrylic resin or polyurethane.

The plastic connecting members 30 are assembled in the preset position 15 of the metal frame 10 to prevent the housing 100 from deforming when dropped or impacted, as shown in FIG. 2. In order to show the plastic filling member 20 in the partition region 101 clearly, the plastic connecting members 30 are omitted from the through holes 101, and only the plastic connecting members 30 are shown in the partition region 101.

Figure 8:
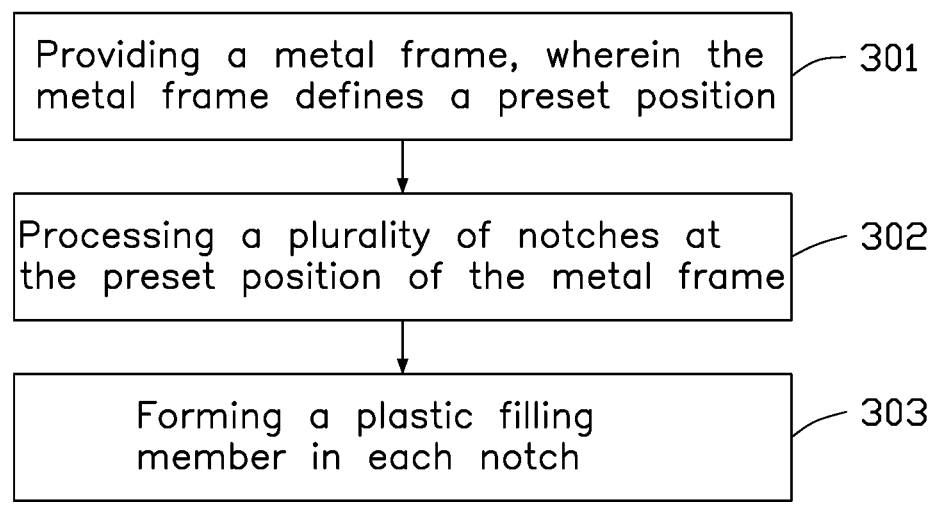
FIG. 8 is a flowchart of a manufacturing method for the housing in FIG. 2.

FIG. 8 illustrates a method for manufacturing the housing 100 according to one embodiment. The method 300 is provided by way of embodiment as there are a variety of ways to carry out the method. The method 300 can begin at block 301.

At block 301, a metal frame 10 is provided. The metal frame 10 is formed by casting, stamping, or CNC machine.

In the embodiment, the metal frame 10 is substantially a rectangular structure and includes a first metal portion 11, two second metal portions 12, two third metal portions 13, and a fourth metal portion 14. The first metal portion 11 is U-shaped. The second metal portion 12 is a cuboid. The third metal portion 13 is substantially L-shaped. The fourth metal portion 14 is a long strip structure. The first metal portion 11, one of the second metal portions 12, one of the third metal portions 13, the fourth metal portion 14, the other third metal portion 13, and the other second metal portion 12 are sequentially arranged to form the rectangular structure of the metal frame 10.

At block 302, notches 16 are formed at the preset positions 15 defined in the metal frame 10. In the embodiment, the preset positions 15 include partition regions 121 and side walls of the through holes 101. The through holes 101 include a headphone hole 102 and a USB hole 103. That is, side wall of the headphone hole 102 and the USB hole 103 are processed to form a notch 16. The partition regions 121 include a first partition region 151 and a second partition region 152. The first metal portion 11 are spaced from the second metal portion 12 and forms the first partition region 151, the second metal portion 12 is connected with the third metal portion 13, the third metal portion 13 is spaced from the fourth metal portion 14 and forms the second partition region 152. Each partition region 15 includes two opposite surfaces, and the notch 16 is formed at one such surface of the partition region.

The notches 16 are formed by laser cutting or CNC technique. In the embodiment, the at least one notch 16 is formed by CNC technique.

The notch 16 at the side wall of the headphone hole 102 is circular (as in FIG. 4), the notch 16 at the side wall of the USB hole 103 is elliptical (as in FIG. 5), the notch 16 at the surface of the second partition region 152 is rectangular (as in FIG. 6), and the notch 16 at the surface of the first partition region 151 is T-shaped (as in FIG. 7).

That is, the CNC cutters have different shapes to formed the different notches 16.

At block 303, the plastic filling members 20 are formed in each notch 16 using an injection molding method. Specifically, the metal frame 10 having the notch 16 is placed in an injection mold cavity, and the molten plastic is injected into the notches 16 defined at the preset regions 15 of the metal frame 10, and the plastic filling member 20 are formed in each notch 16. The plastic filling members 20 are formed in the notches 16 using an injection molding method, the plastic filling members 20 and the metal frame 10 have a strong bonding force and prevent the plastic filling member 20 from separating from the metal frame 10.

A material of the plastic filling member 20 is selected from thermoplastic or thermosetting plastics. Thermoplastic plastics is selected from the group consisting of PBT, PPS, poly PET, PEEK, PC, and PVC. Thermosetting plastics is selected from epoxy resin, polyurea resin, or UV adhesive. The UV adhesive is acrylic resin or polyurethane.

In the embodiment, the preset positions 15 include partition region 101 and side walls of the through holes 121, each partition region 101 and side wall of each through hole 121 are defined with one notch 16. Each notch 16 has one plastic filling member 20, and the plastic filling member 20 promotes closer assembly between the plastic connecting members 30 and the metal frame 10.

The embodiments shown and described above are only examples.

Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A housing adapted for an electronic device comprising:
   a metal frame and a plurality of plastic filling members;
   the metal frame defines a preset position, wherein the preset position comprises at least one partition region and at least one through hole, wherein a plurality of notches are formed at the preset position, the plurality of notches are formed at one surface of the at least one partition region and at side wall of the at least one through hole and each of plurality of the plastic filling members is in each of the plurality of notches.

2. The housing of claim 1, wherein: each of the plurality of notches has a shape of circular, elliptical, square, rectangular, trapezoid, triangular, or T-shaped, and a structure of each of the plurality of plastic filling members is matched with the shape of each of the plurality of notches.

3. The housing of claim 2, wherein:
   the metal frame is substantially a rectangular structure and comprises a first metal portion, two second metal portions, two third metal portions and a fourth metal portion, wherein the first metal portion is U-shaped, the second metal portion is a cuboid, the third metal portion is substantially L-shaped; and the fourth metal portion is a long strip structure; the first metal portion, one of the second metal portions, one of the third metal portions, the fourth metal portion, another one of the third metal portions and another one of the second metal portions are sequentially arranged, and one of the second metal portions is connected with one of the third metal portions.

4. The housing of claim 3, wherein:
the at least one through hole comprises a headphone hole formed at the first metal portion and a USB hole formed at the fourth metal portion.

5. The housing of claim 4, wherein:
the at least one partition region comprises a first partition region and a second partition region; the first partition region is defined between the first metal portion and the second metal portion, the second partition region is defined between the third metal portion and the fourth metal portion.

6. The housing of claim 5, wherein:
the first partition region is a gap between the first metal portion and the second metal portion, the second partition region is a gap between the third metal portion and the fourth metal portion, and each of the first partition region and the second partition region comprises two opposite surfaces, and one such surface of the first partition region forms one notch, and one such surface of the second partition region forms one notch.

7. The housing of claim 1, wherein:
a material of the metal frame is selected from the group consisting of stainless steel, aluminum, magnesium, titanium, copper, and any combination thereof; a material of the plastic filling member is selected from thermo-plastic or thermosetting plastic.

8. The housing of claim 7, wherein:
the thermo-plastic plastics is selected from the group consisting of polybutylene terephthalate (PBT), polyphenylene sulfide (PPS), poly ethylene terephthalate (PET), polyether ketone (PEEK), polycarbonate (PC), and polyvinyl chloride (PVC); thermosetting plastics is selected from epoxy resin, polyurea resin or UV adhesive.

9. The housing of claim 1, wherein: the housing further comprises a plurality of plastic connecting members, and the plastic connecting members are in the partition region and in side wall of the through holes.

10. An electronic device comprising:
a display screen and a housing, and the display screen is detachably assembled in the housing,
wherein the housing comprising a metal frame and a plurality of plastic filling members;
the metal frame defines a preset position, wherein the preset position comprises at least one partition region and at least one through hole, wherein a plurality of notches are formed at the preset position, the plurality of notches are formed at one surface of the at least one partition region and at side wall of the at least one through hole and each of plurality of the plastic filling members is in each of the plurality of notches.

* * * * *